United States Patent
Su et al.

(10) Patent No.: US 10,771,016 B2
(45) Date of Patent: *Sep. 8, 2020

(54) AMPLIFIER CIRCUIT WITH OVERSHOOT SUPPRESSION

(71) Applicant: Novatek Microelectronics Corp., Hsinchu (TW)

(72) Inventors: Chia-Wei Su, Hsinchu (TW); Ju-Lin Huang, Hsinchu County (TW); Keko-Chun Liang, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/249,911

(22) Filed: Jan. 17, 2019

(65) Prior Publication Data

US 2019/0149100 A1  May 16, 2019

Related U.S. Application Data

(63) Continuation of application No. 15/792,774, filed on Oct. 25, 2017, now Pat. No. 10,230,334, which is a continuation of application No. 14/751,152, filed on Jun. 26, 2015, now Pat. No. 9,837,967, which is a continuation-in-part of application No. 14/474,315, filed on Sep. 2, 2014, now abandoned, which is a continuation of application No. 13/339,373, filed on Dec. 29, 2011, now Pat. No. 8,866,550, which is a
(Continued)

(30) Foreign Application Priority Data

Oct. 29, 2009 (TW) .............................. 98136680 A (51) Int. Cl.
H03F 1/08 (2006.01)
H03F 1/52 (2006.01)
H03F 3/30 (2006.01)
H03F 3/45 (2006.01)

(52) U.S. Cl.
CPC ............... *H03F 1/083* (2013.01); *H03F 1/52* (2013.01); *H03F 1/523* (2013.01); *H03F 3/303* (2013.01); *H03F 3/45475* (2013.01); *H03F 2200/129* (2013.01); *H03F 2200/153* (2013.01); *H03F 2200/444* (2013.01); *H03F 2203/30036* (2013.01); *H03F 2203/45218* (2013.01); *H03F 2203/45654* (2013.01); *H03F 2203/45658* (2013.01); *H03F 2203/45686* (2013.01); *H03F 2203/45702* (2013.01)

(58) Field of Classification Search
USPC .................. 330/252–261, 310, 98, 133, 150
See application file for complete search history.

(56) References Cited

U.S. PATENT DOCUMENTS 6,459,340 B1 * 10/2002 Apel .......................... H03F 1/52
330/110
7,274,254 B2 * 9/2007 Hsieh ........................ H03F 1/14
327/112

* cited by examiner

*Primary Examiner* — Hieu P Nguyen
(74) *Attorney, Agent, or Firm* — JCIPRNET (57) ABSTRACT

An amplifier circuit including an input amplifier, an output amplifier and a diode device is provided. The output amplifier is coupled to the input amplifier and outputs an output voltage. The diode device is coupled between an output end and an input end of the output amplifier. When a voltage difference between the output end and the input end of the output amplifier is greater than a barrier voltage of the diode device, the diode device is turned on, and an overshoot of the output voltage is reduced.

19 Claims, 7 Drawing Sheets

Related U.S. Application Data continuation of application No. 12/687,892, filed on Jan. 15, 2010, now Pat. No. 8,111,103.

AMPLIFIER CIRCUIT WITH OVERSHOOT SUPPRESSION

CROSS-REFERENCE TO RELATED APPLICATION

This application is a continuation application of and claims the priority benefit of a prior application Ser. No. 15/792,774 filed on Oct. 25, 2017, now pending. The prior application Ser. No. 15/792,774 is a continuation application of and claims the priority benefit of a prior application Ser. No. 14/751,152 filed on Jun. 26, 2015 now patented as U.S. Pat. No. 9,837,967B2. The prior application Ser. No. 14/751,152 is a continuation-in-part application of and claims the priority benefit of a prior application Ser. No. 14/474,315, filed on Sep. 2, 2014. The prior application Ser. No. 14/474,315 is a continuation application of and claims the priority benefit of patent application Ser. No. 13/339,373, filed on Dec. 29, 2011, now patented as U.S. Pat. No. 8,866,550B2. The prior patent application Ser. No. 13/339,373 is also a continuation application of and claims the priority benefit of patent application Ser. No. 12/687,892, filed on Jan. 15, 2010, now patented as U.S. Pat. No. 8,111,103B2, which claims the priority benefit of Taiwan application serial no. 98136680, filed on Oct. 29, 2009. The entirety of each of the above-mentioned applications is hereby incorporated by reference herein and made a part of this specification.

BACKGROUND OF THE INVENTION

Field of the Invention

The invention relates to an amplifier circuit, and more particularly to an amplifier circuit with an overshoot suppress scheme.

Description of Related Art

In the signal process and control system, the amplifier circuit is usually configured to adjust, transmit, enhance, or reduce signals. The amplifier has a plurality of types. According to the application and the bandwidth requirement of the amplifier, it may be divided into the power amplifier, the tuning amplifier, the input stage amplifier, and the output stage amplifier.

For the conventional amplifier, when it outputs the output voltage, the overshoot may occur in the output voltage during the dynamic operation due to the phase margin, the insufficient area, and so on. The overshoot represents that, in the circuit, the transient instant voltage may not be immediately stabilized and is much greater than the steady voltage during the period of the converting state. When the signal is outputted, it will cause the signal to be unstable. Accordingly, the back circuit to receive the signal may operate abnormally, and even the circuit is burned out. However, in many applications, a steady output voltage is needed, and the problem that the voltage is raised in a very short time must be suppressed within a tolerable scope.

In the prior art, by designing a larger phase margin, the dynamic response becomes slower to suppress the overshoot, and for different conditions, such as the process, the voltage, and the process-voltage-temperature variation (PVT variation), the phase margins in different conditions are much different, so that it is required to change the design of the circuit according to different conditions. Other methods, such as the method of speeding the change of the transient state by increasing the current, or the method of adding capacitors in the output end to reduce the amplitude of the oscillation and stabilize the output voltage, also increase the fabricating cost and the circuit area.

SUMMARY OF THE INVENTION

An embodiment of the invention provides an amplifier circuit with an overshoot suppress scheme. By a diode device, the overshoot is rapidly stabilized in the transient state, and in the steady state, the diode device is cut off to maintain the normal operation of the amplifier circuit, thereby suppressing the overshoot.

An embodiment of the invention provides an amplifier circuit including an input amplifier, an output amplifier and a diode device. The output amplifier is coupled to the input amplifier and outputs an output voltage. The diode device is coupled between an output end and an input end of the output amplifier. When a voltage difference between the output end and the input end of the output amplifier is greater than a barrier voltage of the diode device, the diode device is turned on, and an overshoot of the output voltage is reduced.

Based on the above, in the amplifier circuit of the embodiment of the invention, the diode device is configured to detect the voltage difference between the output end and the input end of the output amplifier. When the voltage difference between the output and the input ends of the output amplifier is greater than the barrier voltage of the diode device, the diode device is turned on, so that the output end of the output amplifier is coupled to the input end of the output amplifier. Accordingly, in the transient state, it may rapidly smooth the output voltage with overshoot. In the steady state, because the voltage difference between the output and the input ends of the output amplifier is less than the barrier voltage of the diode device, the diode device is cut off to maintain the normal operation of the operational amplifier.

To make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
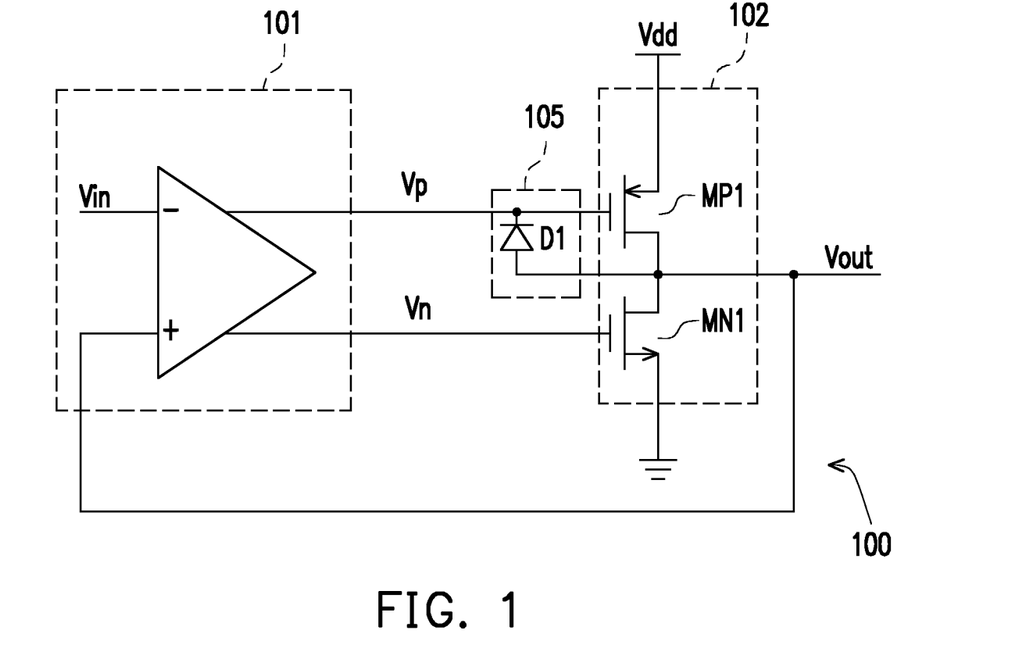
FIG. 1 is a schematic view of an amplifier circuit with the overshoot suppress scheme according to the first embodiment of the invention.

FIG. 1 is a schematic view of an amplifier circuit with an overshoot suppress scheme according to the first embodiment of the invention. Referring to FIG. 1, the amplifier circuit 100 includes an input amplifier 101, an output amplifier 102, and a first diode device 105. In the present embodiment, the input amplifier 101 has a first input end, a second input end, and an output pair. The output amplifier 102 has a first input end, a second input end, and an output end. The first and the second input ends of the output amplifier 102 are respectively coupled to the output pair of the input amplifier 101, and the output end of the output amplifier 102 provides the output voltage Vout.

A first end of the first diode device 105 is coupled to the output end of the output amplifier 102, and a second end of the first diode device 105 is coupled to the first input end of the output amplifier 102. When a voltage difference between the output end of the output amplifier 102 and the first input end of the output amplifier 102 is greater than a barrier voltage of the first diode device 105, the first diode device 105 is turned on.

The first input end of the input amplifier 101 receives the input voltage Vin. Those who use the present embodiment may freely couple the second input end of the input amplifier 101 directly or indirectly to the output end of the output amplifier 102 to form a feedback as required. In some embodiments, the second input end of the input amplifier 101 may be decoupled to the output end of the output amplifier 102. In the present embodiment, the first input end of the input amplifier 101 is an inverting input end, and the second input end of the input amplifier 101 is a non-inverting input end.

In the present embodiment, the amplifier circuit 100 may be an operational amplifier (OPA), wherein the input amplifier 101 is an input stage of the operational amplifier, and the output amplifier 102 is an output stage of the operational amplifier. The output amplifier 102 includes a first transistor and a second transistor. Herein, a p-channel metal oxide semiconductor field-effect transistor (PMOSFET) MP1 is configured to implement the first transistor, and an n-channel metal oxide semiconductor field-effect transistor (NMOSFET) MN1 is configured to implement the second transistor. The first end of the PMOSFET MP1 (e.g. the source) is coupled the first voltage (e.g. the system voltage Vdd), and the second end of the PMOSFET MP1 (e.g. the drain) serves as the output end of the output amplifier 102. The control end of the PMOSFET MP1 (e.g. the gate) serves as the first input end of the output amplifier 102. That is, the gate of the transistor MP1 is coupled to one end of the output pair of the input amplifier 101 to receive the voltage Vp. The first end of the NMOSFET MN1 (e.g. the source) is coupled the second voltage (e.g. the ground voltage), and the second end of the NMOSFET MN1 (e.g. the drain) is coupled to the drain of the transistor MP1. The control end of the NMOSFET MN1 (e.g. the gate) serves as the second input end of the output amplifier 102. That is, the gate of the transistor MN1 is coupled to the other end of the output pair of the input amplifier 101 to receive the voltage Vn.

Herein, the barrier voltage of the first diode device 105 is supposed as Vt. In the present embodiment, the first diode device 105 is a diode D1, and thus, the barrier voltage Vt is the forward cut-in voltage of the diode D1. An anode of the diode D1 is coupled to the output end of the output amplifier 102, and a cathode of the diode D1 is coupled to the first input end of the output amplifier 102.

In the present embodiment, the single diode D1 is configured to implement the first diode device 105, but the implementation of the first diode device 105 is not limited thereto. In other embodiments, the first diode device 105 may be formed by coupling a plurality of diodes to each other in series, and the number of the diodes coupled in series and the amount of the barrier voltage may be freely decided based on the requirement and the normal rated standards. If the back load of the output end of the amplifier circuit is larger, or it is desired to more slowly turn on or cut off the first diode device 105, more diodes coupled in series are needed. On the contrary, if the back load of the output end of the amplifier circuit is smaller or is a capacitor, in order to rapidly finish the transmission of signals, the less number of the diodes coupled in series are needed to speed up the transmission for signals. In this case, the first diode device 105 is integrated in the amplifier circuit 100 to prevent the overshoot without affecting the normal operation of the amplifier circuit 100.

In following, the operation and mechanism of the amplifier circuit 100 will be described. Herein, it is supposed that the system voltage Vdd is 10 voltages (V), the ground voltage is 0V, and the barrier voltage Vt of the first diode device 105 is 1V. In an ideal situation, when the voltage of the output pair of the input amplifier 101 is 8.9V, the output end of the output amplifier 102 correspondingly outputs the output voltage with 9.8V.

Actually, the output voltage overshoots in the transient state when the voltage levels are changed. When the overshoot occurs, the output voltages Vp and Vn of the output pair of the input amplifier 101 and the output voltage Vout of the output amplifier 102 are in the transient state when the voltage levels are changed. The overshoot temporarily causes the voltage Vp over low, and the output voltage Vout over high, and even higher than the system voltage Vdd. When the voltage difference between the output voltage Vout of the output amplifier 102 and the voltage Vp is greater than the barrier voltage Vt of the first diode device 105, the first diode device 105 is turned on, so that the output end of the output amplifier 102 is electrically connected to the first input end of the output amplifier 102. Accordingly, the overshoot current of the output voltage Vout is conducted to the gate of the PMOSFET MP1 in the output amplifier 102, thereby immediately pulling up the gate voltage of the PMOSFET MP1 (i.e. the voltage Vp) to suppress/improve the effect due to overshoot.

In the steady state, the output ends of the input amplifier 101 and the output end of the output amplifier 102 have no overshoot. Based on the above, in the steady state, the voltage Vp of the output pair of the input amplifier 101 is stabilized at 8.9V, so that the output end of the output amplifier 102 correspondingly outputs the output voltage with 9.8V. Because the voltage difference between the output end of the output amplifier 102 and the voltage Vp (i.e. 9.8V−8.9V=0.9V) is less than the barrier voltage Vt of the first diode device 105, the first diode device 105 is cut off. Accordingly, the first diode device 105 does not affect the normal operation of the amplifier circuit 100 in the steady state.

Figure 2:
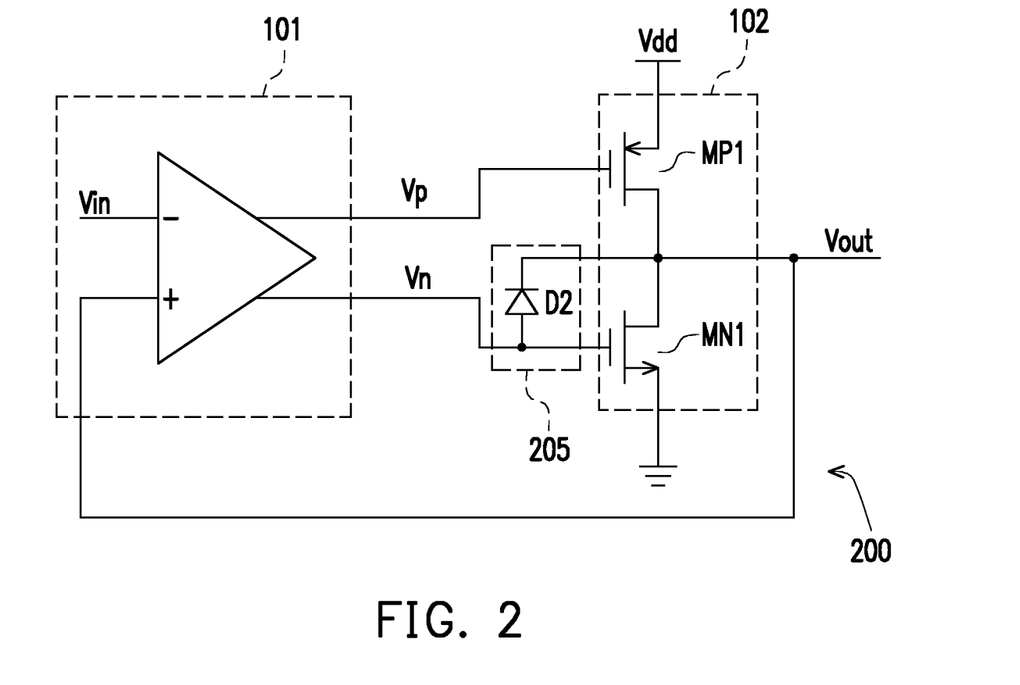
FIG. 2 is a schematic view of an amplifier circuit with the overshoot suppress scheme according to the second embodiment of the invention.

Herein, another embodiment of the invention is provided. FIG. 2 is a schematic view of an amplifier circuit 200 with the overshoot suppress scheme according to the second embodiment of the invention. Referring to FIG. 2, the implementation of the amplifier circuit 200 may refer to the illustration of the amplifier circuit 100, and thus, the same illustration will not be described again. In the second embodiment, the difference between the amplifier circuits 200 and 100 lies in that, a first end of the first diode device 205 is coupled to the output end of the output amplifier 102, and a second end of the first diode device 205 is coupled to the second input end of the output amplifier 102.

Referring to FIG. 2, in the present embodiment, the first diode device 205 is a diode D2, and the anode of the diode D2 is coupled to the second input end of the output amplifier 102 to receive voltage Vn. The cathode of the diode D2 is coupled to the output end of the output amplifier 102. The barrier voltage Vt of the first diode device 205 is the forward cut-in voltage of the diode D2. In the present embodiment, the single diode D2 is configured to implement the first diode device 205, but the implementation of the first diode device 205 is not limited thereto. In other embodiments, the implementation of the first diode device 205 is similar to that of the first diode device 105 in the amplifier circuit 100. Accordingly, the first diode device 205 may be formed by coupling a plurality of diodes to each other in series, and the number of the diodes coupled in series and the amount of the barrier voltage may be freely decided based on the requirement and the normal rated standards.

In following, the operation and mechanism of the amplifier circuit 200 will be described. In the present embodiment, it is supposed that the parameters are the same as those in the first embodiment. In an ideal situation, when the voltage Vn of the output pair of the input amplifier 101 (i.e. the gate voltage of the transistor MN1) is 1.1V, the output end of the output amplifier 102 correspondingly outputs the output voltage Vout with 0.2V. However, the output voltage actually also overshoots in the transient state when the voltage levels are changed. When the overshoot occurs, the output voltages Vp and Vn of the output pair of the input amplifier 101 and the output voltage Vout of the output amplifier 102 are in the transient state when the voltage levels are changed. The overshoot temporarily causes the voltage Vn over high, and the output voltage Vout over low, and even lower than the ground voltage. Accordingly, the voltage difference between the output end of the output amplifier 102 and the voltage Vn is greater than the barrier voltage Vt of the first diode device 205 (e.g. 1V). When Vn−Vout>Vt, the first diode device 205 is turned on, so that the second input end of the output amplifier 102 (i.e. the gate of the NMOSFET MN1) is electrically connected to the output end of the output amplifier 102. Accordingly, the overshoot current of the gate of the NMOSFET MN1 in the output amplifier 102 is conducted to the output end of the output amplifier 102, thereby immediately pulling up the corresponding output voltage Vout to suppress/improve the effect due to overshoot.

In the steady state, the output ends of the input amplifier 101 and the output end of the output amplifier 102 have no overshoot. That is, the voltage Vn of the output pair of the input amplifier 101 is stabilized at 1.1V, so that the output end of the output amplifier 102 correspondingly outputs the output voltage with 0.2V. Because the voltage difference between the output end of the output amplifier 102 and the voltage Vn (i.e. 1.1V−0.2V=0.9V) is less than the barrier voltage Vt of the first diode device 205, the first diode device 205 is cut off. Accordingly, the first diode device 205 does not affect the normal operation of the amplifier circuit 200 in the steady state.

Figure 3:
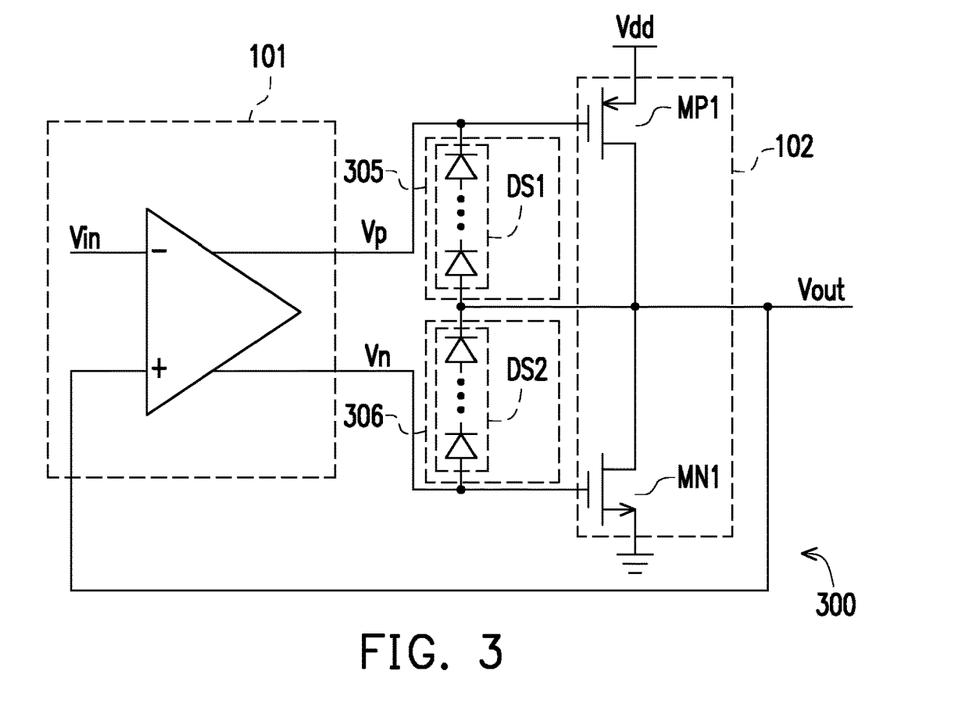
FIG. 3 is a schematic view of an amplifier circuit with the overshoot suppress scheme according to the third embodiment of the invention.

Herein, another embodiment of the invention is provided. FIG. 3 is a schematic view of an amplifier circuit with the overshoot suppress scheme according to the third embodiment of the invention. Referring to FIG. 3, the amplifier circuit 300 with the overshoot suppress scheme is integrated by the amplifier circuits 100 and 200. The implementation of the amplifier circuit 300 may refer to the related illustration of the amplifier circuits 100 and 200. The amplifier circuit 300 has the first diode device 305 and the second diode device 306. The first end of the first diode device 305 is coupled to the output end of the output amplifier 102, and the second end of the first diode device 305 is coupled to the first input end of the output amplifier 102. The first end of the second diode device 306 is coupled to the output end of the output amplifier 102, and the second end of the second diode device 306 is coupled to the second input end of the output amplifier 102.

In the present embodiment, the first diode device 305 includes a plurality of diodes, and the diodes are coupled to each other in series to form a diode string DS1. The diode string DS1 has the barrier voltage Vt1. Herein, the anode of the diode string DS1 serves as the first end of the first diode device 305, and coupled to the output end of the output amplifier 102 to receive the voltage Vout. Furthermore, the cathode of the diode string DS1 serves as the second end of the first diode device 305, and coupled to the first input end of the output amplifier 102 to receive the voltage Vp. The second diode device 306 also includes a plurality of diodes, and the diodes are coupled to each other in series to form a diode string DS2. The diode string DS2 has the barrier voltage Vt2. Herein, the cathode of the diode string DS2 serves as the first end of the second diode device 306, and coupled to the output end of the output amplifier 102. Furthermore, the anode of the diode string DS2 serves as the second end of the second diode device 306, and coupled to the second input end of the output amplifier 102. In the present embodiment, the number of diodes in the diode string DS1 or DS2 and the amount of the barrier voltage Vt1 or Vt2 may be freely decided based on the requirement and the normal rated standards, and it may refer to the related description in the foregoing embodiments.

In some embodiments, the first diode device 305 and/or the second diode device 306 may be formed by a single diode, respectively.

The operation and mechanism of the amplifier circuit 300 may refer to the related illustration of the amplifier circuits 100 and 200. Based on the description in the present embodiment, in the transient state when the voltage levels are changed, the overshoot temporarily causes the voltage Vp over low, and the output voltage Vout over high. When the voltage difference between the output voltage Vout of the output amplifier 102 and the voltage Vp is greater than the barrier voltage Vt1 of the first diode device 305, the first diode device 305 is turned on, so that the overshoot current of the output end of the output amplifier 102 is conducted to the gate of the PMOSFET MP1 in the output amplifier 102, thereby immediately pulling up the gate voltage of the PMOSFET MP1 (i.e. the voltage Vp). Similarly, the overshoot temporarily may cause the voltage Vn over high, and the output voltage Vout over low. When the voltage difference between the output voltage Vout of the output amplifier 102 and the voltage Vn is greater than the barrier voltage Vt2 of the second diode device 306, the second diode device 306 is turned on, so that the overshoot current of the gate of the NMOSFET MN1 is conducted to the output end of the output amplifier 102, thereby immediately pulling up the output voltage Vout to suppress/improve the effect for the voltages Vp and Vn and the output voltage Vout due to overshoot. In the steady state, the voltages Vp and Vn and the output voltage Vout have no overshoot, and the first diode device 305 and the second diode device 306 are both cut off. Accordingly, the first diode device 305 and the second diode device 306 do not affect the normal operation of the amplifier circuit 300 in the steady state.

Figure 4:
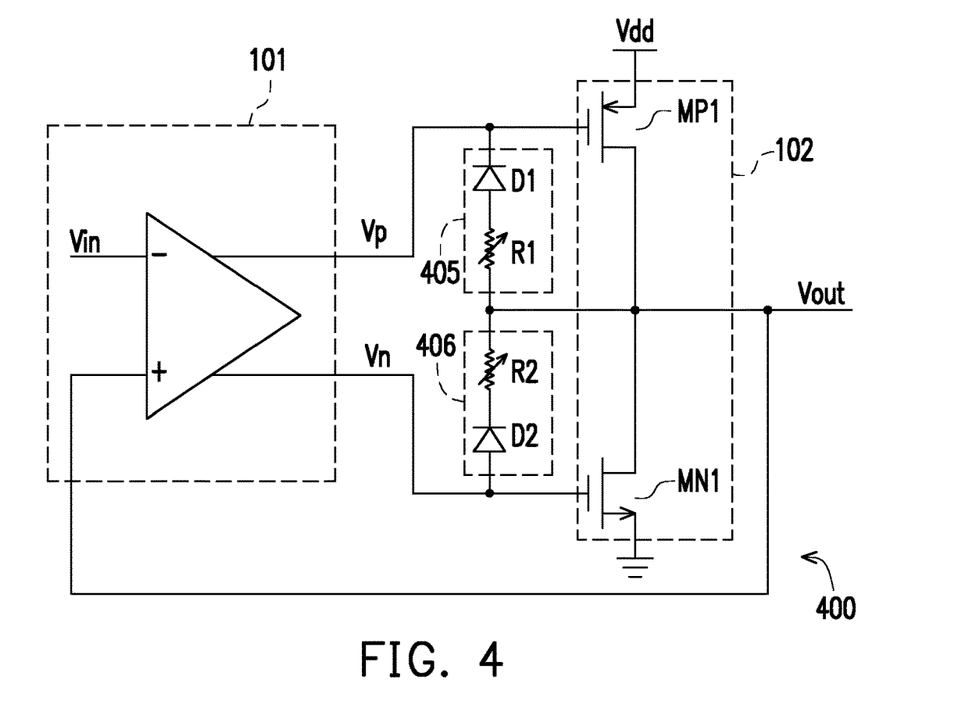
FIG. 4 is a schematic view of an amplifier circuit with the overshoot suppress scheme according to the fourth embodiment of the invention.

Those who use the present embodiment may add a variable resistor to the diode device to increase the barrier voltage of the diode device as shown in FIG. 4. FIG. 4 is a schematic view of an amplifier circuit with the overshoot suppress scheme according to the fourth embodiment of the invention. Referring to FIG. 4, the implementation of the amplifier circuit 400 may refer to the related illustration of the amplifier circuit 300. The difference of the amplifier circuits 400 and 300 lies in that, a variable resistor is added to each of the first diode device 405 and the second diode device 406. The first diode device has a diode D1 and a variable resistor R1. The first end of the variable resistor R1 is coupled to the first end of the diode D1, the second end of the diode D1 serves as one of the first end and the second end of the first diode device 405, and the second end of the variable resistor serves as the other one of the first end and the second end of the first diode device 405. The connection of the diode D2 and the variable resistor R2 in the second diode device 406 is the same as that in the first diode device 405.

In the present embodiment, in the first diode device 405, the first end of the variable resistor R1 is coupled to the anode of the diode D1, and the cathode of the diode D1 is coupled to the first input end of the output amplifier 102. Furthermore, the second end of the variable resistor R1 is coupled to the output end of the output amplifier 102. In the second diode device 406, the second end of the variable resistor R2 is coupled to the output end of the output amplifier 102, and the first end of the variable resistor R2 is coupled to the cathode of the diode D2. Furthermore, the anode of the diode D2 is coupled to the second input end of the output amplifier 102.

Because the variable resistor has no polarity, those who use the present embodiment may freely change the series order of the variable resistor and the diode as required, and it does not alter the operation of the amplifier circuit in the present embodiment. In other embodiments, in the first diode device 405, the first end of the variable resistor R1 may be coupled to the first input end of the output amplifier 102 to receive the voltage Vp, and the second end of the variable resistor R1 and the cathode of the diode D1 are electrically connected. Furthermore, the anode of the diode D1 is coupled to the output end of the output amplifier 102. Similarly, the series order of the diode D2 and the variable resistor R2 may be changed in the second diode device 406.

The variable resistors R1 and R2 are mainly configured to increase the barrier voltages Vt1 and Vt2 of the first diode device 405 and the second diode device 406. Also, by increasing or decreasing the resistances of the variable resistors R1 and R2, the current passing through the first diode device 405 and the second diode device 406 is limited. Accordingly, the variable resistors R1 and R2 serve as current limiters. Compared with the other embodiments, it may increase the barrier voltage of the diode device by increasing the resistance of the variable resistor or increasing the number of diodes coupled in series. When the overshoot occurs, the variable resistor does not increase the period of the transient when the voltage levels are changed. However, when the number of diodes coupled in series is changed, the period of the transient when the voltage levels are changed is correspondingly increased/decreased according to the number of diodes coupled in series. Accordingly, those who use the present embodiment may freely change the number of diodes coupled in series as required.

Figure 5A:
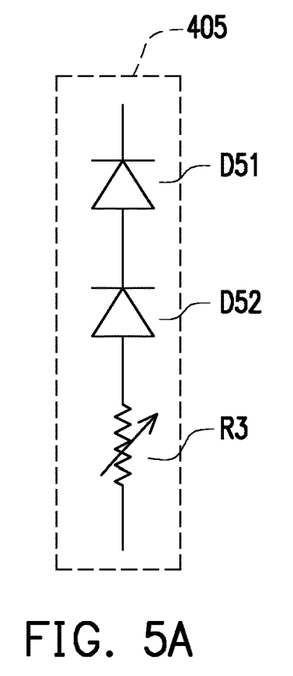
FIG. 5A, FIG. 5B, and FIG. 5C are schematic views illustrating other embodiments of the first diode device in FIG. 4.
Figure 5B:
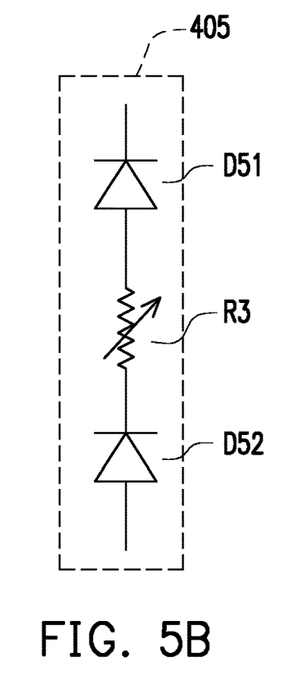
Figure 5C:
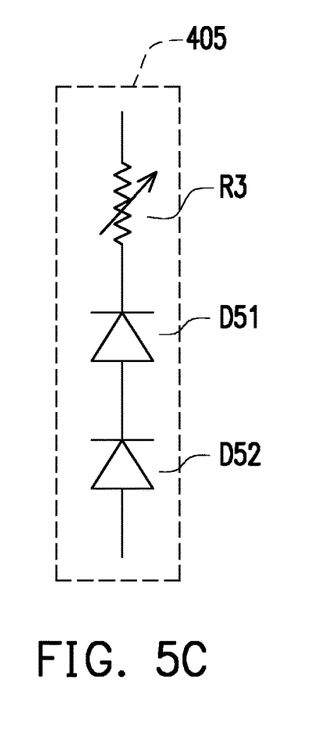

Other applications of the diode device in the present embodiment are shown in FIG. 5. FIG. 5A, FIG. 5B, and FIG. 5C are schematic views illustrating other embodiments of the first diode device 405 in FIG. 4. In following, the embodiment is exemplary by replacing the first diode device 405 in FIG. 4 with the first diode devices 405 in FIG. 5A, FIG. 5B, and FIG. 5C, respectively, and the second diode device 406 may also be implemented by referring to FIG. 5A, FIG. 5B, and FIG. 5C.

In the present embodiment, the first diode devices 405 of FIG. 5A, FIG. 5B, and FIG. 5C respectively include a first diode D51, a second diode D52, and a variable resistor R3. In FIG. 5A and FIG. 5C, the diodes D51 and D52 are coupled to each other in series to form a diode string. The first end of the variable resistor R3 is coupled to the first end of the diode string, and the second end of the diode string serves as the first end or the second end of the first diode device 405. The second end of the variable resistor R3 serves as the other end of the first diode device 405. As a result, the first diode device 405 in FIG. 4 is replaced with the first diode device 405 in FIG. 5A or FIG. 5C. In FIG. 5B, the first end of the variable resistor R3 is coupled to the first end of the first diode D51, and the second end of the variable resistor R3 is coupled to the first end of the second diode D52. Herein, the second end of the first diode D51 serves as one of the first end and the second end of the first diode device 405, and the second end of the second diode D52 serves as the other end of the first diode device 405. As a result, the first diode device 405 in FIG. 4 is replaced with the first diode device 405 in FIG. 5B. In the present embodiment, the series order of the first diode D51, the second diode D52, and the variable resistor R3 may be freely changed as that in FIG. 5A, FIG. 5B, or FIG. 5C as required, and the invention is not limited thereto. In other applications of the present embodiment, the first diode D51 and the second diode D52 may be diode strings formed by one or more than one diodes.

Figure 6A:
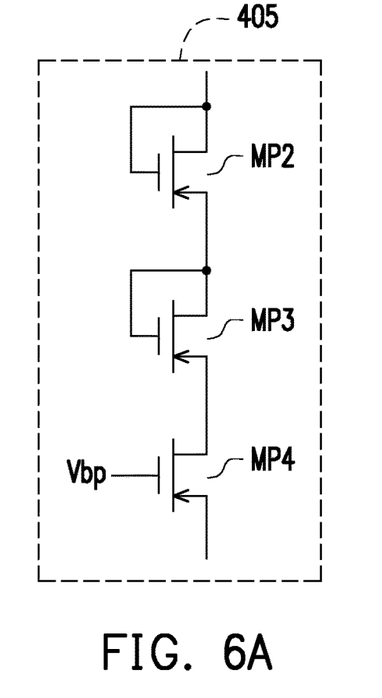
FIG. 6A, FIG. 6B, and FIG. 6C are schematic views respectively illustrating other embodiments of the first diode device in FIG. 5A, FIG. 5B, and FIG. 5C.
Figure 6B:
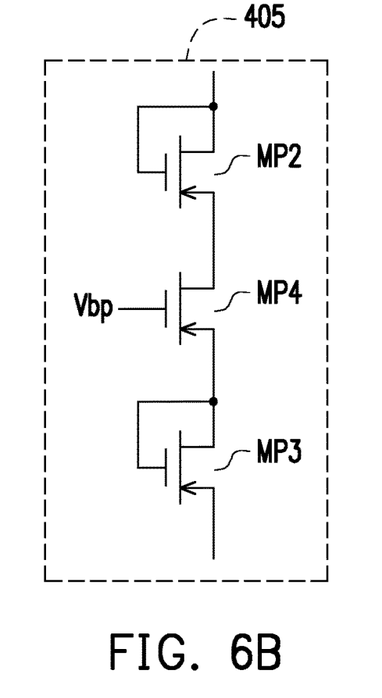
Figure 6C:
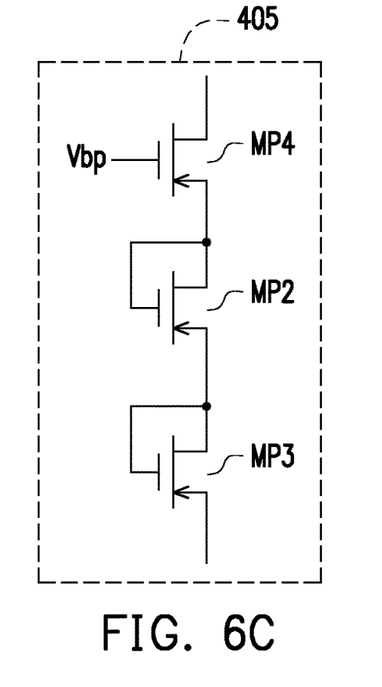

In the foregoing embodiments, the first diode device 405 or the second diode device 406 may also be implemented by MOSFET. By using MOSFET, the diode device may be integrated in the integrated circuit to reduce the circuit area and the cost. FIG. 6A, FIG. 6B, and FIG. 6C are schematic views respectively illustrating other embodiments of the first diode device 405 in FIG. 5A, FIG. 5B, and FIG. 5C. In the present embodiment, the PMOSFETs are configured to implement the first diode device 405. In the present embodiment, the first diode D51, the second diode D52, and the variable resistor R3 in FIG. 5A, FIG. 5B, and FIG. 5C respectively correspond to the PMOSFETs MP2, MP3, and MP4 in FIG. 6A, FIG. 6B, and FIG. 6C The drain and the gate of each of the PMOSFETs MP2 and MP3 are connected together, and the drains and the sources of the PMOSFETs MP2 and MP3 respectively serve as the anode and the cathode of the diode. Accordingly, the first diode D51 and the second diode D52 in FIG. 5 are formed. The gate of the transistor MP4 is connected to the bias voltage Vbp, and the source and the drain of the PMOSFET MP4 serve as the two ends of the variable resistor, so that the transistor MP4 is formed as the variable resistor R3. Accordingly, the bias voltage Vbp may be configured to adjust the amount of the resistance, thereby increasing/decreasing the barrier voltage Vt1 of the first diode device 405 and serving as the current limiter.

Figure 6D:
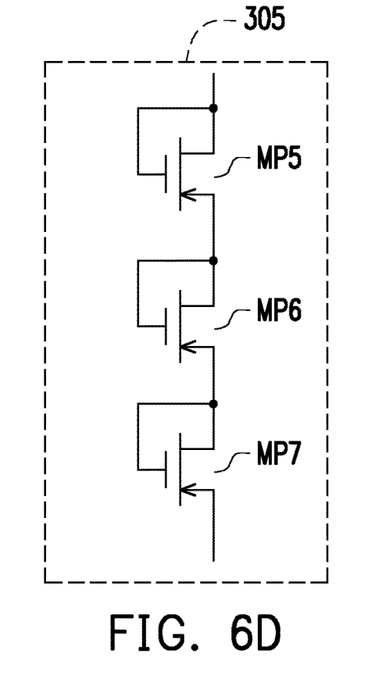
FIG. 6D is a schematic view illustrating another embodiment of the first diode device in FIG. 3.

Moreover, FIG. 6D is a schematic view illustrating another embodiment of the first diode device 305 in FIG. 3. In the present embodiment, the drain and the gate of each of the transistors MP5, MP6, and MP7 in the first diode device 305 are connected together. Furthermore, the drain of each of the transistors MP5, MP6, and MP7 serves as the cathode of the diode, and the source of each of the transistors MP5, MP6, and MP7 serves as the anode of the diode. Accordingly, three diodes are formed. These diodes are coupled to each other in series to form a diode string. Other characteristics of the diode string is similar to that of the first diode device 305 in FIG. 3, which is formed by coupling three diodes in series. It may refer to the related illustration of the amplifier circuit 300.

Figure 7A:
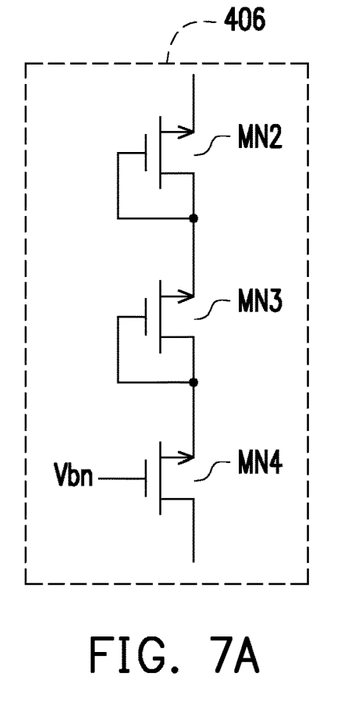
FIG. 7A, FIG. 7B, and FIG. 7C are schematic views illustrating other embodiments of the second diode device in FIG. 4.
Figure 7B:
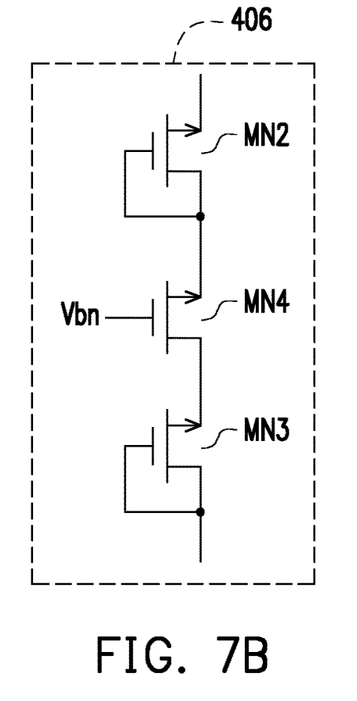
Figure 7C:
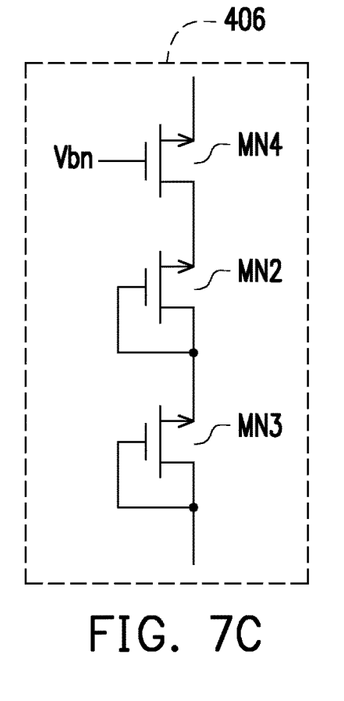

FIG. 7A, FIG. 7B, and FIG. 7C are schematic views illustrating other embodiments of the second diode device 406 in FIG. 4. The first diode device 405 may also be implemented by referring FIG. 7A, FIG. 7B, and FIG. 7C. In the present embodiment, the NMOSFETs are configured to implement the second diode device 406. In the present embodiment, the NMOSFETs MN2 and MN3 in FIG. 7A, FIG. 7B, and FIG. 7C are configured as the diodes, and the NMOSFET MN4 is configured as the variable resistor. The drain and the gate of each of the NMOSFET MN2 and the NMOSFET MN3 are also connected together, and the drains and the sources of the NMOSFETs MN2 and MN3 respectively serve as the cathode and the anode of the diode. The gate of the transistor MN4 is connected to the bias voltage Vbn, and the source and the drain of the NMOSFET MN4 serve as the two ends of the variable resistor. Furthermore, the bias voltage Vbn may be configured to adjust the amount of the resistance.

Figure 7D:
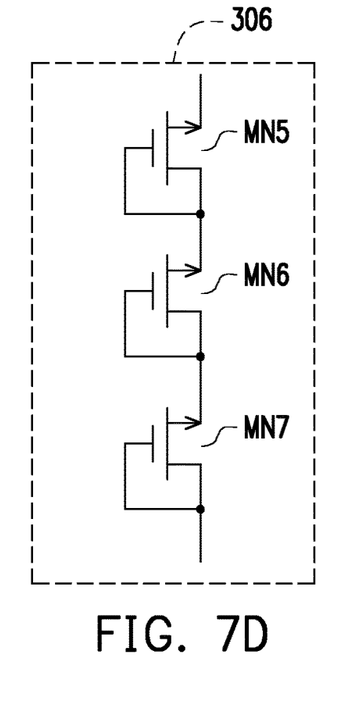
FIG. 7D is a schematic view illustrating another embodiment of the second diode device in FIG. 3.

Moreover, FIG. 7D is a schematic view illustrating another embodiment of the second diode device 306 in FIG. 3. Similar to that in FIG. 6D, the drain and the gate of each of the transistors MN5, MN6, and MN7 in the second diode device 306 are connected together. Furthermore, the drain and the source of each of the transistors MN5, MN6, and MN7 respectively serve as the cathode and the anode of the diode. Accordingly, three diodes are formed. These diodes are coupled to each other in series to form a diode string. Other characteristics of the diode string is similar to that of the second diode device 306 in FIG. 3, which is formed by coupling three diodes in series. It may refer to the related illustration of the amplifier circuit 300.

Figure 8:
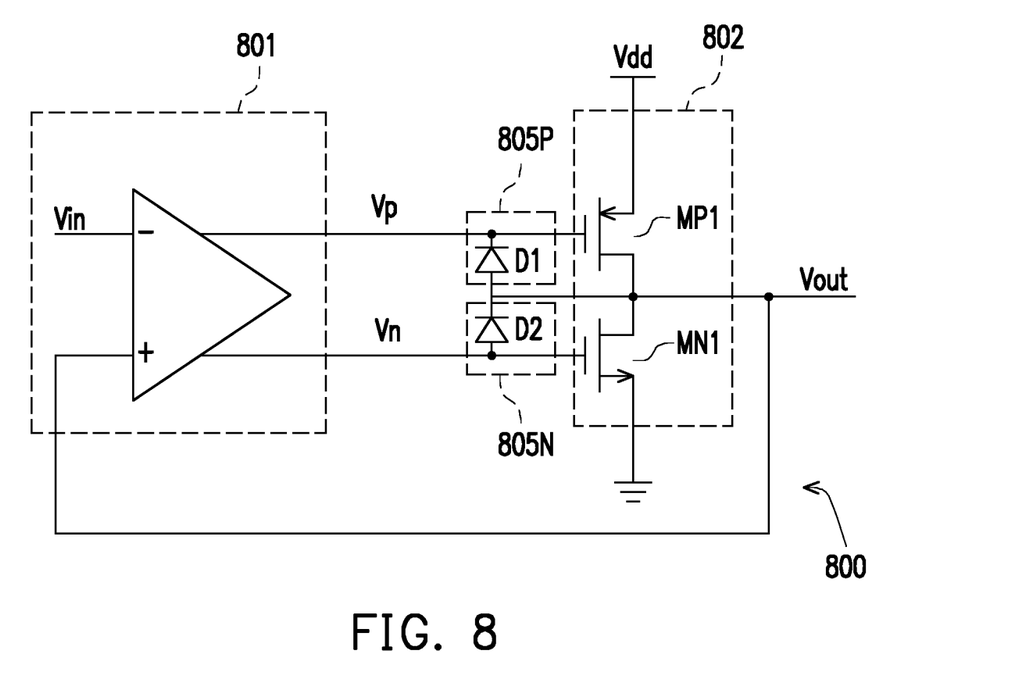
FIG. 8 is a schematic view of an amplifier circuit with the overshoot suppress scheme according to the fifth embodiment of the invention.

FIG. 8 is a schematic view of an amplifier circuit with an overshoot suppress scheme according to the fifth embodiment of the invention. Referring to FIG. 8, the amplifier circuit 800 includes an input amplifier 801, an output amplifier 802, a first diode device 805P, and a second diode device 805N. In the present embodiment, the input amplifier 801 has a first input end, a second input end, and an output pair. The output amplifier 802 has a first input end, a second input end, and an output end. The first and the second input ends of the output amplifier 802 are respectively coupled to the output pair of the input amplifier 801, and the output end of the output amplifier 802 provides the output voltage Vout.

A first end of the first diode device 805P is coupled to the output end of the output amplifier 802, and a second end of the first diode device 805P is coupled to the first input end of the output amplifier 802. When a voltage difference between the output end of the output amplifier 802 and the first input end of the output amplifier 802 is greater than a barrier voltage of the first diode device 805P, the first diode device 805P is turned on. In the present embodiment, the first diode device 805P may include a single diode D1, but the invention is not limited thereto.

A first end of the second diode device 805N is coupled to the second input end of the output amplifier 802, and a second end of the second diode device 805N is coupled to the output end of the output amplifier 802. When a voltage difference between the output end of the output amplifier 802 and the second input end of the output amplifier 802 is greater than a barrier voltage of the second diode device 805N, the second diode device 805N is turned on. In the present embodiment, the second diode device 805N may include a single diode D2, but the invention is not limited thereto.

The first input end of the input amplifier 801 receives the input voltage Vin. Those who use the present embodiment may freely couple the second input end of the input amplifier 801 directly or indirectly to the output end of the output amplifier 802 to form a feedback as required. In some embodiments, the second input end of the input amplifier 801 may be decoupled to the output end of the output amplifier 802. In the present embodiment, the first input end of the input amplifier 801 is an inverting input end, and the second input end of the input amplifier 801 is a non-inverting input end.

In the present embodiment, the amplifier circuit 800 may be an operational amplifier (OPA), wherein the input amplifier 801 is an input stage of the operational amplifier, and the output amplifier 802 is an output stage of the operational amplifier. The output amplifier 802 includes a first transistor and a second transistor. Herein, a p-channel metal oxide semiconductor field-effect transistor (PMOSFET) MP1 is configured to implement the first transistor, and an n-channel metal oxide semiconductor field-effect transistor (NMOSFET) MN1 is configured to implement the second transistor. The first end of the PMOSFET MP1 (e.g. the source) is coupled the first voltage (e.g. the system voltage Vdd), and the second end of the PMOSFET MP1 (e.g. the drain) serves as the output end of the output amplifier 802. The control end of the PMOSFET MP1 (e.g. the gate) serves as the first input end of the output amplifier 802. That is, the gate of the transistor MP1 is coupled to one end of the output pair of the input amplifier 801 to receive the voltage Vp. The first end of the NMOSFET MN1 (e.g. the source) is coupled the second voltage (e.g. the ground voltage), and the second end of the NMOSFET MN1 (e.g. the drain) is coupled to the drain of the transistor MP1. The control end of the NMOSFET MN1 (e.g. the gate) serves as the second input end of the output amplifier 802. That is, the gate of the transistor MN1 is coupled to the other end of the output pair of the input amplifier 801 to receive the voltage Vn.

Herein, the barrier voltage of the first diode device 805P is supposed as Vt. In the present embodiment, the first diode device 805P includes the single diode D1, and thus, the barrier voltage Vt is the forward cut-in voltage of the diode D1. An anode of the diode D1 is coupled to the output end of the output amplifier 802, and a cathode of the diode D1 is coupled to the first input end of the output amplifier 802.

In the present embodiment, the single diode D1 is configured to implement the first diode device 805P, but the implementation of the first diode device 805P is not limited thereto. In other embodiments, the first diode device 805P may be formed by coupling a plurality of diodes to each other in series, and the number of the diodes coupled in series and the amount of the barrier voltage may be freely decided based on the requirement and the normal rated standards. If the back load of the output end of the amplifier circuit is larger, or it is desired to more slowly turn on or cut off the first diode device 805P, more diodes coupled in series are needed. On the contrary, if the back load of the output end of the amplifier circuit is smaller or is a capacitor, in order to rapidly finish the transmission of signals, the less number of the diodes coupled in series are needed to speed up the transmission for signals. In this case, the first diode device 805P is integrated in the amplifier circuit 800 to prevent the overshoot without affecting the normal operation of the amplifier circuit 800.

In following, the operation and mechanism of the amplifier circuit 800 will be described. Herein, it is supposed that the system voltage Vdd is 10 voltages (V), the ground voltage is 0V, and the barrier voltage Vt of the first diode device 805P is 1V. In an ideal situation, when the voltage of the output pair of the input amplifier 801 is 8.9V, the output end of the output amplifier 802 correspondingly outputs the output voltage with 9.8V.

Actually, the output voltage overshoots in the transient state when the voltage levels are changed. When the overshoot occurs, the output voltages Vp and Vn of the output pair of the input amplifier 801 and the output voltage Vout of the output amplifier 802 are in the transient state when the voltage levels are changed. The overshoot temporarily causes the voltage Vp over low, and the output voltage Vout over high, and even higher than the system voltage Vdd. When the voltage difference between the output voltage Vout of the output amplifier 802 and the voltage Vp is greater than the barrier voltage Vt of the first diode device 805P, the first diode device 805P is turned on, so that the output end of the output amplifier 802 is electrically connected to the first input end of the output amplifier 802. Accordingly, the overshoot current of the output voltage Vout is conducted to the gate of the PMOSFET MP1 in the output amplifier 802, thereby immediately pulling up the gate voltage of the PMOSFET MP1 (i.e. the voltage Vp) to suppress/improve the effect due to overshoot.

In the steady state, the output ends of the input amplifier 801 and the output end of the output amplifier 802 have no overshoot. Based on the above, in the steady state, the voltage Vp of the output pair of the input amplifier 801 is stabilized at 8.9V, so that the output end of the output amplifier 802 correspondingly outputs the output voltage with 9.8V. Because the voltage difference between the output end of the output amplifier 802 and the voltage Vp (i.e. 9.8V-8.9V=0.9V) is less than the barrier voltage Vt of the first diode device 805P, the first diode device 805P is cut off. Accordingly, the first diode device 805P does not affect the normal operation of the amplifier circuit 800 in the steady state.

On the other hand, the second diode device 805N includes the single diode D2, and the anode of the diode D2 is coupled to the second input end of the output amplifier 802 to receive voltage Vn. The cathode of the diode D2 is coupled to the output end of the output amplifier 802. The barrier voltage Vt of the second diode device 805N is the forward cut-in voltage of the diode D2. In the present embodiment, the single diode D2 is configured to implement the second diode device 805N, but the implementation of the second diode device 805N is not limited thereto. The second diode device 805N may be formed by coupling a plurality of diodes to each other in series, and the number of the diodes coupled in series and the amount of the barrier voltage may be freely decided based on the requirement and the normal rated standards.

In following, the operation and mechanism of the amplifier circuit 800 will be described. In an ideal situation, when the voltage Vn of the output pair of the input amplifier 801 (i.e. the gate voltage of the transistor MN1) is 1.1V, the output end of the output amplifier 802 correspondingly outputs the output voltage Vout with 0.2V. However, the output voltage actually also overshoots in the transient state when the voltage levels are changed. When the overshoot occurs, the output voltages Vp and Vn of the output pair of the input amplifier 801 and the output voltage Vout of the output amplifier 802 are in the transient state when the voltage levels are changed. The overshoot temporarily causes the voltage Vn over high, and the output voltage Vout over low, and even lower than the ground voltage. Accordingly, the voltage difference between the output end of the output amplifier 802 and the voltage Vn is greater than the barrier voltage Vt of the second diode device 805N (e.g. 1V). When Vn−Vout>Vt, the second diode device 805N is turned on, so that the second input end of the output amplifier 802 (i.e. the gate of the NMOSFET MN1) is electrically connected to the output end of the output amplifier 802. Accordingly, the overshoot current of the gate of the NMOSFET MN1 in the output amplifier 802 is conducted to the output end of the output amplifier 802, thereby immediately pulling up the corresponding output voltage Vout to suppress/improve the effect due to overshoot.

In the steady state, the output ends of the input amplifier 801 and the output end of the output amplifier 802 have no overshoot. That is, the voltage Vn of the output pair of the input amplifier 801 is stabilized at 1.1V, so that the output end of the output amplifier 802 correspondingly outputs the output voltage with 0.2V. Because the voltage difference between the output end of the output amplifier 802 and the voltage Vn (i.e. 1.1V−0.2V=0.9V) is less than the barrier voltage Vt of the second diode device 805N, the second diode device 805N is cut off. Accordingly, the second diode device 805N does not affect the normal operation of the amplifier circuit 800 in the steady state.

Figure 9:
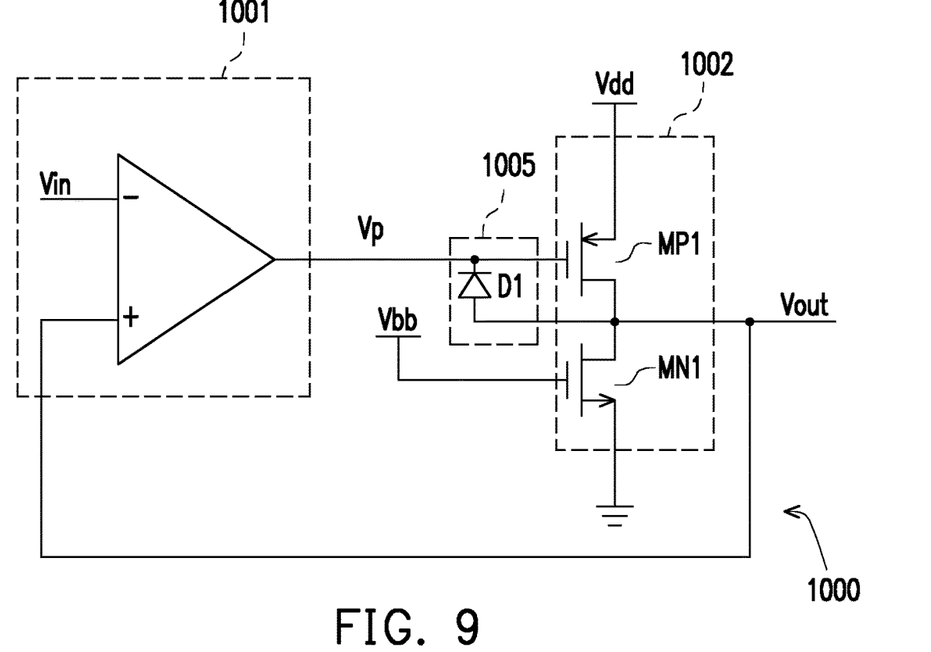
FIG. 9 is a schematic view of an amplifier circuit with the overshoot suppress scheme according to the sixth embodiment of the invention.

Herein, another embodiment of the invention is provided. FIG. 9 is a schematic view of an amplifier circuit with the overshoot suppress scheme according to the sixth embodiment of the invention. Referring to FIG. 8 and FIG. 9, the amplifier circuit 1000 of the present embodiment is similar to the amplifier circuit 800 of FIG. 8, and the main difference therebetween may, for example, lie in that the input amplifier 1001 has a single-ended output, and outputs a single-ended output voltage Vp to the output amplifier 1002 via the single-ended output.

To be specific, the amplifier circuit 1000 includes an input amplifier 1001, an output amplifier 1002, and a diode device 1005. In the present embodiment, the input amplifier 1001 has a first input end, a second input end, and a single-ended output. The output amplifier 1002 has a first input end, a second input end, and an output end. The first input end of the output amplifier 1002 is coupled to the single-ended output of the input amplifier 1001, and the second input end of the output amplifier 1002 is coupled to a bias voltage Vbb. The output end of the output amplifier 1002 provides the output voltage Vout.

In the present embodiment, the gate of the transistor MN1 is connected to the bias voltage Vbb. The bias voltage Vbb may be variable or constant, and is between the ground voltage and the system voltage Vdd. For a variable bias voltage Vbb, the source and the drain of the NMOSFET MN1 serve as two ends of a variable resistor. The bias voltage Vbb may be configured to adjust the amount of the resistance. For a constant bias voltage Vbb, the source and the drain of the NMOSFET MN1 serve as two ends of a load.

Besides, the operation of the amplifier circuit 1000 for suppressing overshoot described in the present embodiment of the invention is sufficiently taught, suggested, and embodied in the exemplary embodiment illustrated in FIG. 8, and therefore no further description is provided herein.

Accordingly, no matter what type of the input amplifier is, the overshoot current of the output voltage Vout is conducted to the gate of the PMOSFET MP1 in the output amplifier 1002, thereby immediately pulling up the gate voltage of the PMOSFET MP1 (i.e. the voltage Vp) to suppress/improve the effect due to overshoot.

Figure 10:
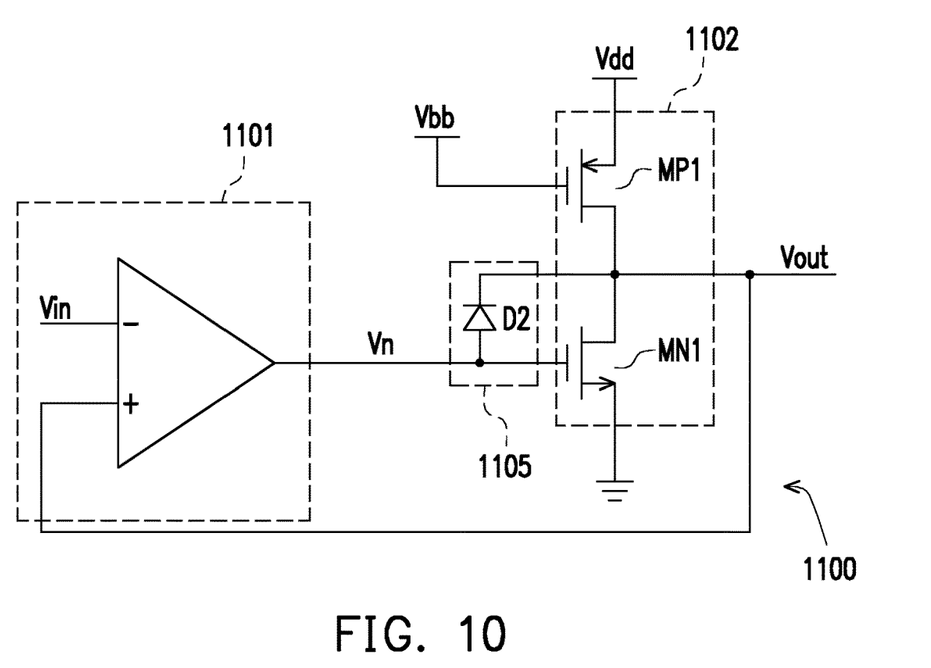
FIG. 10 is a schematic view of an amplifier circuit with the overshoot suppress scheme according to the seventh embodiment of the invention.

Herein, another embodiment of the invention is provided. FIG. 10 is a schematic view of an amplifier circuit with the overshoot suppress scheme according to the seventh embodiment of the invention. Referring to FIG. 8 and FIG. 10, the amplifier circuit 1100 of the present embodiment is similar to the amplifier circuit 800 of FIG. 8, and the main difference therebetween may, for example, lie in that the input amplifier 1101 has a single-ended output, and outputs a single-ended output voltage Vn to the output amplifier 1102 via the single-ended output.

To be specific, the amplifier circuit 1100 includes an input amplifier 1101, an output amplifier 1102, and a diode device 1105. In the present embodiment, the input amplifier 1101 has a first input end, a second input end, and a single-ended output. The output amplifier 1102 has a first input end, a second input end, and an output end. The first input end of the output amplifier 1102 is coupled to a bias voltage Vbb, and the second input end of the output amplifier 1102 is coupled to the single-ended output of the input amplifier 1101. The output end of the output amplifier 1102 provides the output voltage Vout.

In the present embodiment, the gate of the transistor MP1 is connected to the bias voltage Vbb. The bias voltage Vbb may be variable or constant, and is between the ground voltage and the system voltage Vdd. For a variable bias voltage Vbb, the source and the drain of the PMOSFET MP1 serve as two ends of a variable resistor. The bias voltage Vbb may be configured to adjust the amount of the resistance. For a constant bias voltage Vbb, the source and the drain of the NMOSFET MN1 serve as two ends of a load.

Besides, the operation of the amplifier circuit 1100 for suppressing overshoot described in the present embodiment of the invention is sufficiently taught, suggested, and embodied in the exemplary embodiment illustrated in FIG. 8, and therefore no further description is provided herein.

Accordingly, no matter what type of the input amplifier is, the overshoot current of the gate of the NMOSFET NM1 is conducted to the output voltage Vout in the output amplifier 1102, thereby immediately pulling up the output voltage Vout to suppress/improve the effect due to overshoot.

To sum up, in the amplifier circuit of the embodiments of the invention, the diode device is configured to detect the voltage difference between the output end and the input end of the output amplifier. When the voltage difference between the output and the input ends of the output amplifier is greater than the barrier voltage of the diode device, the diode device is turned on, so that the output end of the output amplifier is coupled to the input end of the output amplifier. Accordingly, in one scenario, the overshoot occurs in the output voltage during the period of the transient state when the voltage levels are changed, and by using the diode device, the overshoot current of the output voltage is conducted to the input end of the output amplifier, thereby immediately pulling up the input end of the output amplifier to suppress/improve the effect due to overshoot. Similarly, in another scenario, the overshoot occurs in the output voltage during the period of the transient state when the voltage levels are changed, and by using the diode device, the overshoot current of the input end of the output amplifier is conducted to the output end of the output amplifier, thereby immediately pulling up the output voltage of the output amplifier to suppress/improve the effect due to overshoot.

In the steady state, because the voltage difference between the output and the input ends of the output amplifier is less than the barrier voltage of the diode device, the diode device is cut off to maintain the normal operation of the operational amplifier. The diode device may include the variable resistor to increase the barrier voltage of the diode device. Furthermore, comparing the method of adding the variable resistor and the method of increasing the number of the diodes coupled in series, both of them may increase the barrier voltage of the diode device, but the method of adding the variable resistor may not increase the transient period when the voltage levels are changed. By increasing or decreasing the resistance, the variable resistor may limit the current passing through the diode device to serve as the current limiter. The amplifier circuit may also be integrated in the integrated circuit to reduce the circuit area and the cost.

Although the invention has been described with reference to the above embodiments, it is apparent to one of the ordinary skill in the art that modifications to the described embodiments may be made without departing from the spirit of the invention. Accordingly, the scope of the invention will be defined by the attached claims not by the above detailed descriptions.

What is claimed is:

1. An amplifier circuit, comprising:
   an input amplifier;
   an output amplifier coupled to the input amplifier and outputting an output voltage; and
   a diode device coupled between an output end and an input end of the output amplifier, wherein when a voltage difference between the output end and the input end of the output amplifier is greater than a barrier voltage of the diode device, the diode device is turned on, and an overshoot of the output voltage is reduced,
   wherein the amplifier circuit further comprises a first variable resistor.

2. The amplifier circuit as claimed in claim 1, wherein the diode device comprises:
   a diode,
   wherein a first end of the first variable resistor coupled to a first end of the diode, a second end of the diode serving as one of the first and the second ends of the diode device, and a second end of the first variable resistor serving as the other one of the first and the second ends of the diode device.

3. The amplifier circuit as claimed in claim 1, wherein the diode device comprises:

a plurality of diodes coupled in series to form a diode string,
wherein a first end of the first variable resistor coupled to a first end of the diode string, a second end of the diode string serving as one of the first and the second ends of the diode device, and a second end of the first variable resistor serving as the other one of the first and the second ends of the diode device.

4. The amplifier circuit as claimed in claim 1, wherein the diode device comprises:
a first diode; and
a second diode,
wherein a first end of the first variable resistor coupled to a first end of the first diode, a second end of the first variable resistor coupled to a first end of the second diode, a second end of the first diode serving as one of the first and the second ends of the diode device, and a second end of the second diode serving as the other one of the first and the second ends of the diode device.

5. The amplifier circuit as claimed in claim 1, further comprising another diode device, wherein a first end of the another diode device is coupled to the output end of the output amplifier, and a second end of the another diode device is coupled to another input end of the output amplifier.

6. The amplifier circuit as claimed in claim 5, wherein the another diode device comprises a diode, an anode of the diode is coupled to the output end of the output amplifier, and a cathode of the diode is coupled to the another input end of the output amplifier.

7. The amplifier circuit as claimed in claim 5, wherein the another diode device comprises a diode, an anode of the diode is coupled to the another input end of the output amplifier, and a cathode of the diode is coupled to the output end of the output amplifier.

8. The amplifier circuit as claimed in claim 5, wherein the another diode device comprises a plurality of diodes, the diodes are coupled in series to form a diode string, an anode of the diode string is coupled to the another input end of the output amplifier, and a cathode of the diode string is coupled to the output end of the output amplifier.

9. The amplifier circuit as claimed in claim 5, wherein the another diode device comprises a plurality of diodes, the diodes are coupled in series to form a diode string, an anode of the diode string is coupled to the output end of the output amplifier, and a cathode of the diode string is coupled to the another input end of the output amplifier.

10. The amplifier circuit as claimed in claim 5, further comprises a second variable resistor, wherein the another diode device comprises:
a diode,
wherein a first end of the second variable resistor coupled to a first end of the diode, a second end of the diode serving as one of the first and the second ends of the another diode device, and a second end of the second variable resistor serving as the other one of the first and the second ends of the another diode device.

11. The amplifier circuit as claimed in claim 5, further comprises a second variable resistor, wherein the another diode device comprises:
a plurality of diodes coupled in series to form a diode string,
wherein a first end of the second variable resistor coupled to a first end of the diode string, a second end of the diode string serving as one of the first and the second ends of the another diode device, and a second end of the second variable resistor serving as the other one of the first and the second ends of the another diode device.

12. The amplifier circuit as claimed in claim 5, further comprises a second variable resistor, wherein the another diode device comprises:
a first diode; and
a second diode,
wherein a first end of the second variable resistor coupled to a first end of the first diode, a second end of the second variable resistor coupled to a first end of the second diode, a second end of the first diode serving as one of the first and the second ends of the another diode device, and a second end of the second diode serving as the other one of the first and the second ends of the another diode device.

13. The amplifier circuit as claimed in claim 1, wherein the amplifier circuit is an operational amplifier, the input amplifier is an input stage of the operational amplifier, and the output amplifier is an output stage of the operational amplifier.

14. The amplifier circuit as claimed in claim 1, wherein the output amplifier comprises:
a first transistor, a first end of the first transistor coupled to a first voltage, a second end of the first transistor serving as the output end of the output amplifier, and a control end of the first transistor serving as the input end of the output amplifier; and
a second transistor, a first end of the second transistor coupled to a second voltage, a second end of the second transistor coupled to the second end of the first transistor, and a control end of the second transistor serving as another input end of the output amplifier.

15. The amplifier circuit as claimed in claim 14, wherein the first transistor is a p-channel metal oxide semiconductor field-effect transistor, and the second transistor is an n-channel metal oxide semiconductor field-effect transistor.

16. The amplifier circuit as claimed in claim 15, wherein the first voltage is a system voltage, and the second voltage is a ground voltage.

17. The amplifier circuit as claimed in claim 1, wherein the output end of the output amplifier is coupled to an input end of the input amplifier.

18. The amplifier circuit as claimed in claim 1, wherein an input end of the input amplifier is a non-inverting input end, and another input end of the input amplifier is an inverting input end.

19. An amplifier circuit, comprising:
an input amplifier;
an output amplifier coupled to the input amplifier and outputting an output voltage; and
a diode device coupled between an output end and an input end of the output amplifier, wherein when a voltage difference between the output end and the input end of the output amplifier is greater than a barrier voltage of the diode device, the diode device is turned on, and an overshoot of the output voltage is reduced,
wherein the input amplifier is an input amplifier having a single-ended output, and outputs a single-ended output voltage to the output amplifier via the single-ended output,
wherein another input end of the output amplifier is biased in a bias voltage, and the bias voltage is between a ground voltage and a system voltage.

* * * * *